United States Patent [19]

Nishioka et al.

[11] Patent Number: 5,450,036
[45] Date of Patent: Sep. 12, 1995

[54] POWER AMPLIFIER CIRCUIT FOR AUDIO SIGNAL AND AUDIO DEVICE USING THE SAME

[75] Inventors: Kei Nishioka; Masanori Fujisawa, both of Kyoto, Japan

[73] Assignee: Rohm Co., Ltd., Kyoto, Japan

[21] Appl. No.: 199,890

[22] Filed: Feb. 22, 1994

[30] Foreign Application Priority Data

Feb. 23, 1993 [JP] Japan .................................. 5-057803

[51] Int. Cl.⁶ ............................ H03F 3/30; H03F 3/68
[52] U.S. Cl. ...................................... 330/273; 330/295; 330/297
[58] Field of Search .................. 330/124 R, 202, 267, 330/273, 295, 297; 381/120, 121

[56] References Cited

U.S. PATENT DOCUMENTS

| | | | |
|---|---|---|---|
| 4,218,660 | 8/1980 | Carver | 330/297 |
| 4,472,687 | 9/1984 | Kashiwagi et al. | 330/297 |
| 4,507,619 | 3/1985 | Dijkstra et al. | 330/297 |
| 5,200,711 | 4/1993 | Anderson et al. | 330/297 X |

Primary Examiner—James B. Mullins
Attorney, Agent, or Firm—Fay, Sharpe, Beall, Fagan, Minnich & McKee

[57] ABSTRACT

The present invention includes an amplifier for amplifying an audio signal, a switching circuit for switching power from a power source line at a frequency exceeding an audible frequency and feeding the amplifier and a control circuit for controlling a switching period of the switching circuit such that the power feeding the amplifier correspondingly to a difference in voltage between the feeding power and one of the voltage of the audio signal and the voltage of the audio signal amplified by the amplifier is changed correspondingly to a level of the audio signal.

8 Claims, 5 Drawing Sheets

POWER AMPLIFIER CIRCUIT FOR AUDIO SIGNAL AND AUDIO DEVICE USING THE SAME

DESCRIPTION

1. Technical Field

The present invention relates to a power amplifier circuit for an audio signal and an audio device using the same and, particularly, to a power amplifier circuit capable of reducing power consumption in an output circuit of an audio device, particularly, a portable audio device, such as a radio receiver, a cassette tape recorder, video tape recorder, a video camera or and a component stereo device, which amplifies an audio signal of voice or musical sound and outputs the signal from a loud speaker or generates an audio signal.

2. Background Art

Figure 6:
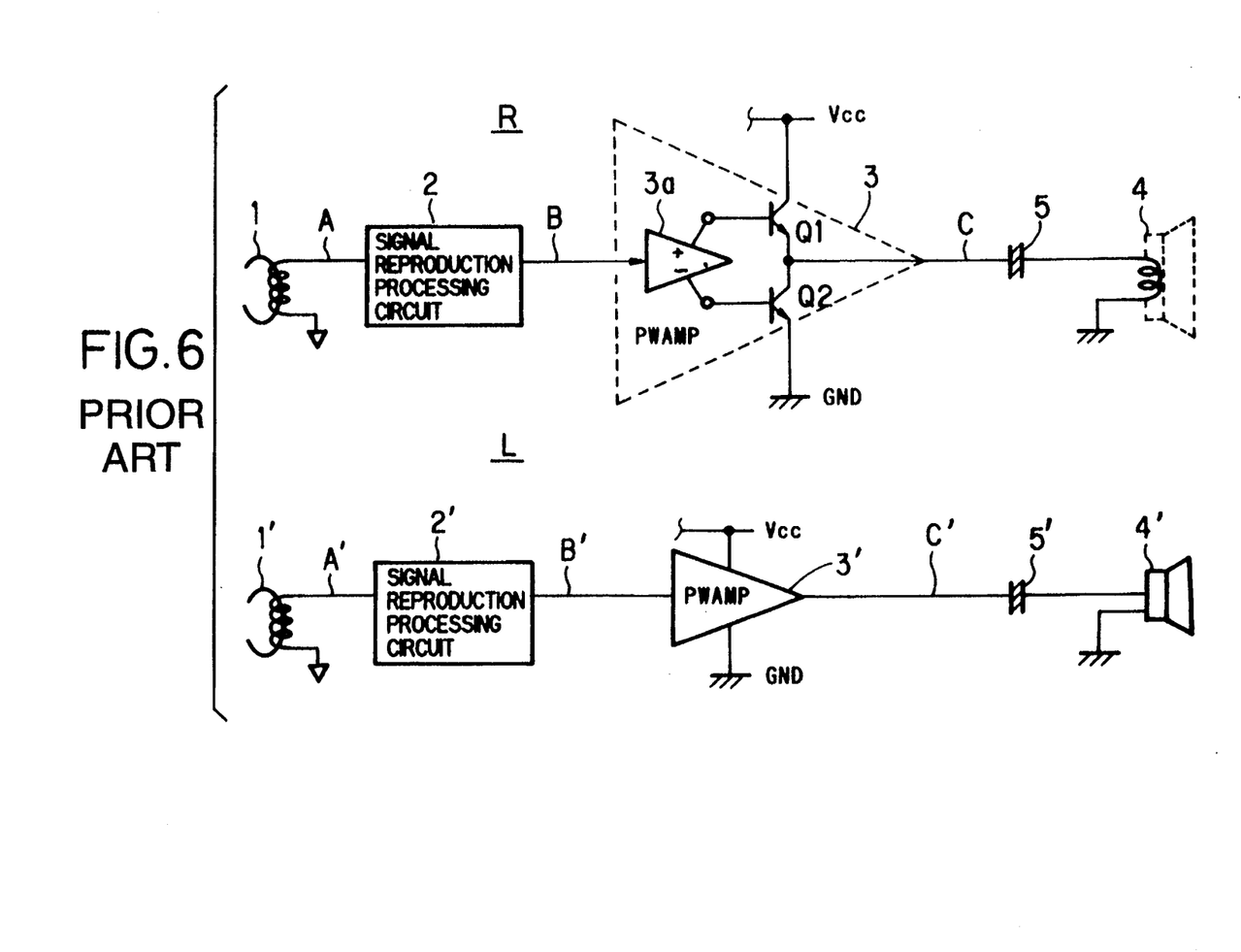
FIG. 6 is a block diagram of a conventional portable stereo cassette tape player.

FIG. 6 is a schematic block circuit diagram of a signal reproducing system of a conventional portable cassette tape player as an example of the audio device. 1 depicts a read head, 2 a signal reproduction processing circuit including a head amplifier and an equalizer circuit, etc., 3 an output amplifier, 4 a loud speaker as a load and 5 an electrolytic capacitor inserted between the amplifier 3 and the loud speaker 4.

During reproduction, the audio signal recorded on a tape (not shown) is read out therefrom through the read head 1 as a read signal A. The read signal A is input to the signal reproduction processing circuit 2 in which a high frequency bias component thereof during recording is removed and, after equalization processing, output as an audio signal B. The thus reproduced audio signal B is amplified by the output amplifier 3 in which an output signal C is produced which is sent to the loud speaker 4 through the capacitor 5. As a result, a reproduced sound is generated by the loud speaker 4.

It is usual that an input stage amplifier 3a is provided in an input stage of the transistor amplifier amplifier 3, for producing a pair of signals. The audio signal B is amplified by this input stage amplifier 3a to provide a pair of signals whose phases are different from each other by 180°. These signals are supplied to transistors Q1 and Q2 which constitute an output stage amplifier (push-pull amplified) thereby to power amplify the audio signal B to obtain the output signal C.

Describing the power amplification in detail, a voltage of a power line Vcc which feeds the output stage amplifier 3 in accordance with the input signal B is lowered by the transistor Q1 to a voltage level of the output signal C. In other words, the output signal C is produced as a result of the amount of voltage drop by an internal impedance of the transistor Q1 and is changed according to a waveform of the audio signal B. In this case, the transistor Q1 handles a voltage difference between the line voltage Vcc and the voltage of the output signal C. As a result, the transistor Q1 consumes a power corresponding to the voltage difference.

Although the output stage amplifier is shown in the figure as comprising a simple circuit including the output transistors Q1 and Q2, a peripheral circuit including a drive circuit, etc., may be included in a practical circuit construction.

It is well known that a cassette tape recorder is generally of the stereo type, and as with other audio devices is equipped with another signal reproducing system (1', 2', 3', 4', 5') such as an L channel system with respect to an R channel system or an R channel system with respect to an L channel system. An audio signal B' of the additional signal reproducing system is used to produce an output signal C' through a similar signal processing. Therefore, the above mentioned power consumption of the transistor Q1 becomes twice that in the case of a stereo device.

Power caused by the voltage drop of the output transistors is dissipated by the power amplifier transistor as heat. Therefore, transistors whose power loss is large are required. Since a large power is consumed there, power efficiency in the case of production of the output signal C is low.

This fact is is a problem in a portable audio device which is operated by a battery of limited capacity since an operating time thereof depends upon the efficient utilization of power. Further, for such device, it is very important, as a commercial product, that it is operable for a long period of time. Therefore, power consumption of the device should be as small as possible.

SUMMARY OF THE INVENTION

An object of the present invention is to provide a power amplifier circuit for audio signal, which is capable of reducing power consumption of an output circuit thereof.

Another object of the present invention is to provide a power amplifier circuit for audio signal, which can use transistors whose power loss is made small by reducing the power consumption of the transistors of the output circuit thereof.

A further object of the present invention is to provide an audio device capable of reducing power consumption of an output circuit thereof.

A still further object of the present invention is to provide an audio device which is suitable as a portable device.

A power amplifier circuit for an audio signal and an audio device using the same according to the present invention, achieve the above objects, and are featured by comprising an amplifier for amplifying an audio signal, a switching circuit responsive to a frequency exceeding an audible frequency for supplying power from a power line to the amplifier and a control circuit for controlling the switching period of the switching circuit such that the power supplied in accordance with a voltage difference between a power line voltage and either one of a voltage of the audio signal and a voltage of an amplified audio signal obtained by amplifying the audio signal by the amplifier is changed correspondingly to a level of the audio signal.

By providing such a control circuit and such a switching circuit between the amplifier and the power line, the power to be supplied to the amplifier is generated by a switching control. Further, the voltage of the power supplied to the amplifier is fedback correspondingly to the voltage of the audio signal. Therefore, it is possible to keep the voltage difference between the voltages of the supplied power and the output signal of the amplifier constant. Thus, it is possible to keep the constant voltage difference at a minimum voltage necessary for the operation of the amplifier or at a constant value within a low voltage range if it is not the minimum voltage.

The constant voltage difference corresponds, in the amplifier, to a voltage drop for generating the output signal. Therefore, in this case, the amplifier performs an amplifying operation with the voltage drop in the amplifier being kept at the minimum voltage or at the constant low voltage. A current value of the output signal in this case is determined by the power supplied from the switching circuit and corresponds to the input audio signal. Further, power consumption of the amplifier in this case is substantially determined by the above mentioned constant voltage. Therefore, the power consumption becomes smaller compared with that when an output signal is obtained by a direct voltage drop from the constant supply voltage as in the conventional system.

On the other hand, a total power loss of the switching circuit and the control circuit, for switching the source line voltage Vcc, is mainly generated transiently only at the switching time of and ON resistance of a switching transistor thereof. The power loss is very minor compared with the conventional system in which such loss is generated always. An increase of power consumption due to this is relatively small compared with the power consumption in the power amplifier stage.

Therefore, it is possible to reduce the power loss consumed by amplification of the audio signal as a whole. For this reason, it is possible to improve the power utilization efficiency.

In the present invention, the switching of the power supply line is performed at a timing exceeding an audible frequency. Therefore, even if a distortion component caused by the switching operation is included in the amplified audio signal, that component is hardly heard finally. Therefore, the quality of the audio signal is not degraded practically and the performance as an audio device can be maintained.

BRIEF DESCRIPTION OF THE DRAWINGS

FIGS. 2(a)–(c) show waveforms for explaining an operation of a supply power control circuit in FIG. 1;

DESCRIPTION OF THE PREFERRED EMBODIMENTS

Figure 1:
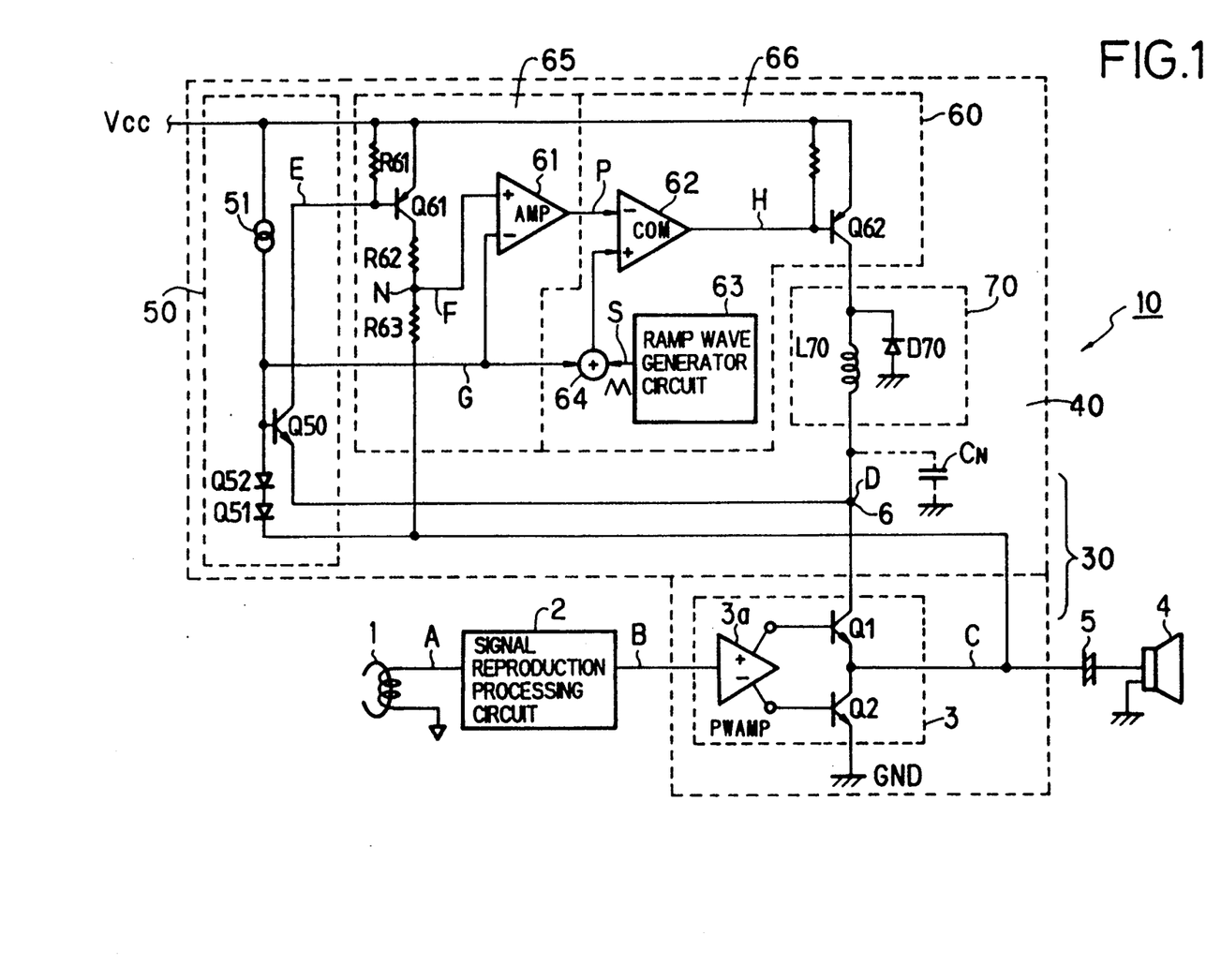
FIG. 1 is a block diagram of an audio device according to an embodiment of the present invention when applied to a portable cassette tape player.

In FIG. 1, output stage circuit 30 is an output stage amplifier circuit of a portable cassette tape player 10, which includes, in addition to an amplifier 3 shown in FIG. 6, a supply power control circuit 40. In FIG. 1, the same components as those in FIG. 6 are depicted by the same reference numerals, respectively. Therefore, detailed descriptions thereof are omitted. Although not shown, a supply line Vcc is connected to a plus side output voltage line of a battery for the portable audio device.

The supply power control circuit 40 is a power control circuit which regulates an output power under control of pulse width modulation (PWM) such that voltage of the output power is maintained at a constant value with respect to an output signal of an audio signal. A supply current control is performed correspondingly to a variation of internal impedance of an output transistor Q1 which is determined corresponding to a signal level of an input signal. In order to do so, a voltage of the output voltage and a voltage of an output signal C are detected. And, a power corresponding to a difference therebetween is supplied to the transistor Q1 and a control is performed such that a potential difference between an output side of the transistor Q1 and a power supply terminal becomes constant. By this, a power corresponding to the input signal (or output signal) is supplied simultaneously.

This circuit 40 is composed of a detection circuit 50, a switching regulation circuit 60 and a smoothing circuit 70. A capacitor CN depicted by a dotted line is for by-passing high frequency signal and has a capacitance of in the order of 2000 P. This capacitor is theoretically unnecessary.

The switching regulation circuit 60 is a circuit inserted in between the power source line Vcc and a power supply terminal (output terminal 6). This is composed of a control voltage value generating circuit 65 and a switching circuit 66. The control voltage value generating circuit 65 has a transistor Q61 and an amplifier 61 and generates a control voltage value for the switching control. The switching circuit 66 includes a comparator 62, a switching transistor Q62 and a ramp wave generator circuit 63, so that ON/OFF switching controls the power supply line connected to the power source line Vcc by the transistor Q62 and a resultant power is sent to the output terminal 6 through the smoothing circuit 70. This becomes a supply power D for the amplifier 3 which is generated at the output terminal 6.

Under control of the supply power control circuit 40, the voltage at the output terminal 6 is changed according to the level of the output signal C. However, since the potential difference between the output terminal 6 and the output terminal of the output signal of the transistor Q1 is maintained constant, power consumption in the transistor Q1 is reduced as mentioned previously. That is, in this case, when the signal level of the output signal C is low, the voltage at the output terminal 6 becomes low correspondingly. When the signal level of the output signal C is high, the voltage at the output terminal 6 becomes high correspondingly.

A total power consumption of the supply power control circuit 40 and the transistor Q1 must be smaller than that consumed by the conventional transistor Q1. This can be achieved by selecting high frequency as the switching frequency, for example, making it as high as 50 kHz to 800 kHz, and by maintaining the potential difference between the output terminal 6 and the output terminal of the output signal of the transistor Q1 at a constant voltage lower than an average voltage drop from the conventional power source line Vcc. By this, it is restricted to a smaller value than an average power consumption generated by a voltage drop from the power source voltage Vcc in the conventional transistor Q1.

As mentioned previously, the amplifier 3 push-pull amplifies the audio signal B by the transistors Q1 and Q2 to perform power amplification and generates the amplified output signal C.

The detection circuit 50 is constituted mainly with an NPN transistor Q50 having a detection terminal provided between a base and emitter thereof. Its detection signal E is supplied to the transistor Q61 of the switching regulation circuit 60 to switch ON/OFF the transistor Q62. The transistor Q50 receives at its emitter a voltage of the supply power D and at its base a voltage of the output signal C output from the amplifier 3 and fed through forward-connected diodes D51 and D52. As a result, a detecting operation of the detection circuit 50 depends upon whether or not a voltage difference VD−C between the voltage of the supply power D and the voltage of the output signal C is larger than 1 Vf (base-emitter forward drop voltage).

When this voltage difference VD−C is not larger than 1 Vf, the transistor Q50 is turned ON. By this, a current corresponding to the detection signal E (=error voltage) of the voltage difference 1 Vf−VD−C is supplied to the transistor Q61. The transistor Q61 generates a voltage which is amplified correspondingly to this error voltage as a voltage-divided voltage F (to be described later). On the other hand, when the voltage difference VD−C is larger than 1 Vf, the transistor Q50 is turned OFF. By this, a detection signal E of constant voltage (=Vcc) is generated. Incidentally, 51 is a constant current source for maintaining the diodes D51 and D52 in ON state and generates a reference signal G which is higher than the output voltage C by 2×1 Vf (=2 Vf) at a base of the transistor Q50.

The control voltage value generating circuit 65 responds to the detection signal E to generate a comparison voltage value P for the comparator 62. This generates a voltage value between the voltage of the power source line Vcc and the voltage of the output signal C at a junction N between series connected resistor circuits R62 and R63 as the voltage-divided voltage F when the transistor Q61 is turned On in response to the detection signal E from the detection circuit 50, in other words, when the voltage difference between the voltage of the output signal C and the voltage of the supply power D becomes not larger than 1 Vf.

The amplifier 61 responds to this voltage-divided voltage F to generate the above mentioned comparison voltage value P by amplifying a difference signal between that and the voltage of the reference signal G. And, it outputs that to a (−) input (on the side of a reference terminal) of the comparator 62.

When the transistor Q61 is turned OFF in response to a reception of the detection signal E from the detection circuit 50, that is, when the voltage difference between the voltage of the output signal C and the voltage of the supply power D of the output terminal 6 becomes larger than 1 Vf, the comparison voltage value P is generated by the amplification of the voltage difference (=2 Vf) between the output signal C and the reference signal G by means of the amplifier 61. This becomes a constant value (as will described later, lower than the signal level of the ramp wave).

The comparator 62 receives at its (+) input a ramp signal S having a constant frequency exceeding the audible frequency from the ramp wave generator circuit 63. And, it compares the voltage of the comparator voltage value P with the voltage of the signal S and outputs a HIGH level signal by which the PNP transistor Q62 is turned OFF as a drive pulse H when the voltage of the signal S exceeds the voltage of the comparison voltage value P. This drive pulse H is supplied to the transistor Q62. It should be noted that the ramp signal S is based on the voltage of the reference signal G and the reference signal G and the signal S are synthesized in a synthesizer circuit 64 before it is input to the comparator 62.

The smoothing circuit 70 is connected to an output of the transistor Q62 of the switching circuit 66 and smooths its output power. This circuit includes mainly a coil L70 inserted in series between the output of the transistor Q62 and the power supply line (output terminal 6) to the amplifier 3. With the coil L70, switched power is smoothed, resulting in a smoothed supply power D at the output terminal 6. A flywheel diode is connected between an input terminal of the coil L70 and a ground GND. By this diode, a circular path for a current flowing through the coil L70 is formed. By this, energy stored in the coil L70 when the power supply line is blocked by the switching transistor Q62 is supplied to the side of the amplifier 3 as an inertia current and returned to the coil L70.

Next, an operation of the switching regulation circuit 60 for controlling the voltage difference VD−C between the supply power D and the output signal C to substantially 1 Vf will be described.

Figure 2A:
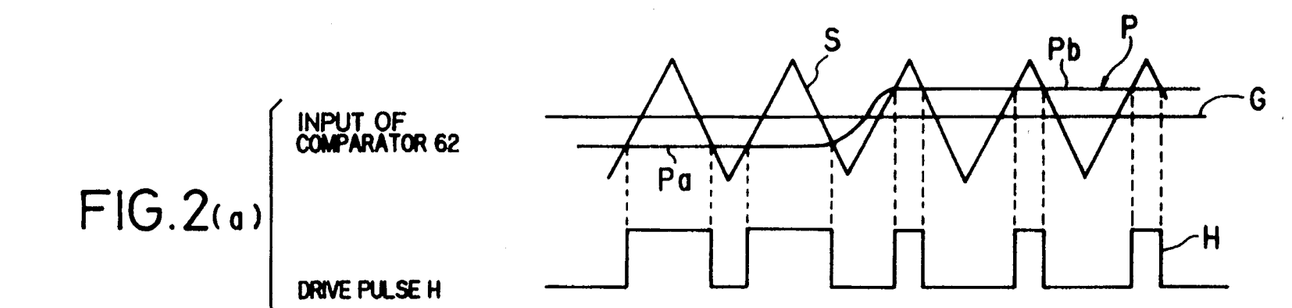

As shown in FIG. 2(a), the comparator 62 receives at one input the ramp signal S having the reference signal G as a reference and at the other input the comparison voltage value P.

When the voltage difference VD−C is not larger than 1 Vf, as shown in FIG. 2(a), the comparator 62 generates a binary drive pulse H corresponding to a result of comparison in level between the ramp signal level (waveform S) and the output signal (waveform P) of the amplifier 61, with which the transistor Q62 is switched ON/OFF. In this case, the level Pa of a forward half of the signal P is lower than the reference signal G. This corresponds to a state where the voltage difference VD−C is maintained at slightly lower than 1 Vf but substantially equal to 1 Vf. The level Pb of a rearward half of the signal P is higher than the reference signal G. In this case, the voltage difference VD−C is lower than 1 Vf. In this case, a time period of the drive pulse H for which the latter is at a HIGH level is short so that an amount of supply power D is increased. By this, it is controlled such that the supply power D is increased to increase its voltage to thereby make the voltage difference VD−C becomes substantially 1 Vf.

By this, when the voltage difference VD−C is not larger than 1 Vf, the level of the comparison voltage value P is changed in a direction in which the difference is made substantially equal to 1 Vf and a current corresponding thereto is supplied to the amplifier 3. And, the voltage difference VD−C becomes substantially 1 Vf. That is, the PWM is performed correspondingly to a result of comparison between the comparison voltage value P and the ramp wave S and the switching transistor Q62 is ON/OFF controlled by the drive pulse H. Such control is performed correspondingly to the value of the detection signal E.

Figure 2B:
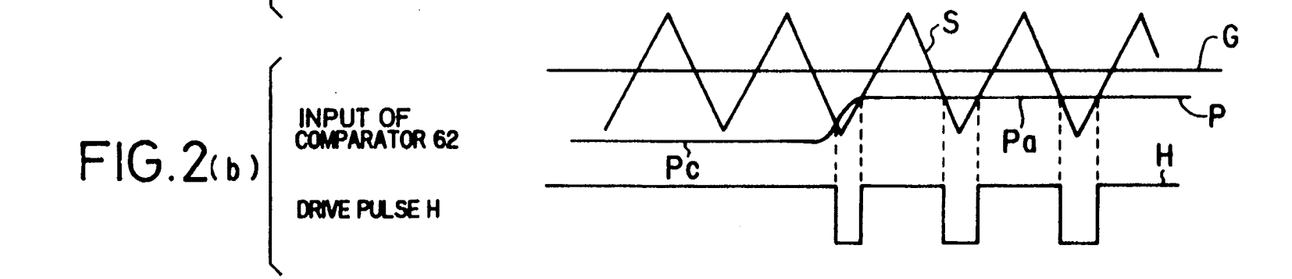
Figure 2C:
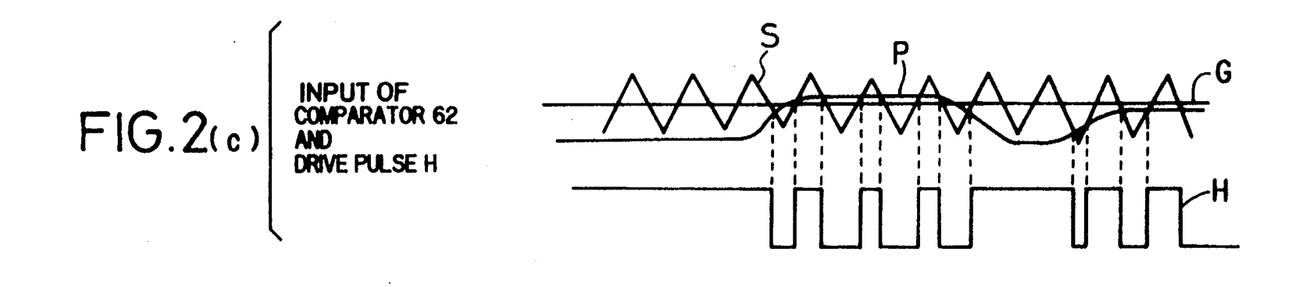

When the difference between the voltage of the output signal C and the voltage of the supply power D is larger than 1 Vf, the transistor Q50 is turned OFF. In this case, the detection voltage E becomes the source voltage Vcc. Therefore, the transistor Q61 is turned OFF, generating the voltage difference 2 Vf. As a result, the comparison voltage value P becomes a level Pc shown in FIG. 2(b) and a constant voltage which is lower than the reference signal G by 2 Vf is supplied to the comparator 62. As a result, a drive pulse H such as shown by a high level waveform H in FIG. 2(c) is generated to turn OFF the transistor Q62 of the switching. As a result, the power supply is performed to the amplifier 3 such that the voltage difference VD−C becomes substantially 1 Vf and the comparison voltage value P is returned to the level Pa.

The above mentioned level Pa of the comparison voltage value P is determined by values of the resistors R62 and R63 and is selectable. Further, the above mentioned level Pc of the comparison voltage value P is determined in relation to an amplitude of the ramp wave and this is also selectable. Further, a response speed to a change of the level of the comparison voltage value P is high enough against a change of the audio signal and is selectable in designing the circuit.

As a specific example of operation, for example, when the voltage level of the input signal B is decreased largely, the internal impedance of the transistor Q1 is abruptly increased and the voltage difference between the voltage of the output signal C and the voltage of the supply power D of the output terminal 6 becomes higher than 1 Vf. In this case, the comparison voltage value P becomes lower in level than the ramp wave S as shown by Pc and the drive pulse H of the comparator 62 is maintained at a HIGH level to maintain the transistor Q62 in OFF state. Such control is performed continuously until the voltage difference between the output signal C and the voltage of the supply power D of the output terminal 6 becomes near 1 Vf.

For example, when the voltage level of the input signal B is increased largely, the internal impedance of the transistor Q1 is lowered abruptly and the voltage difference between the output signal C and the voltage of the supply power D of the output terminal 6 becomes lower than 1 Vf. In such case, the comparison voltage value Pb corresponding to an error reducing 1 Vf is supplied. By this, the control is performed such that the voltage of the supply power D is increased to make an aimed value of the voltage difference equal to 1 Vf.

And, for a gentle change of the level of the input signal B, the two controls for the case where it is equal to or lower than 1 Vf and for the case where it is higher than 1 Vf are performed alternatively for a short time correspondingly to the change of the internal impedance of the transistor Q1, resulting in alternating pulses including pulses having a width covering a plurality of cycles of the ramp signal S and pulses having a shorter width, as shown in FIG. 2(c).

The frequency of the ramp wave is preferably within a range of 100 kHz to 500 KHz in view of the fact that an upper limit of the audible frequency is generally 20 KHz and in view of the ease of regulation of an oscillator circuit and power efficiency.

In this case, 1 Vf (about 0.7 V) of the voltage difference VD−C which is the aimed value of control is a value determined in correspondence to the fact that the transistor Q1 of the amplifier 3 is a single state transistor. That is, the voltage difference VD−C between the voltage of the supply power D to the amplifier 3 and the voltage of the output signal C of the amplifier 3 is selected from values which do not degrade the response performance of the transistor Q1 as a value which is as close as possible to a collector—emitter voltage which is the minimum necessary to allow the amplifier 3 to perform its amplification operation. Therefore, if the transistor Q1 is composed of Darlington-connected transistors, the above mentioned voltage difference VD−C is made 2 Vf (about 1.4 V). In detail, another diode is further connected to the diodes D51 and D52.

Now, an operation of this tape player will be described.

During reproduction, the read signal A is obtained from a tape (not shown) on which the audio signal is recorded, through the read head 1. With respect to this read signal A, the audio signal B is obtained by the signal reproducing processing circuit 2. This audio signal B is push-pull amplified by the transistors Q1 and Q2 of the amplifier 3. In this case, the current corresponding to the level of the input signal B for the upper half cycle of the reference level of the audio signal B is supplied from the supply power control circuit 40. For the lower half cycle, the current supplied to the capacitor 5 is sunk through the transistor Q2. By this, the input signal B is power-amplified to provide the output signal C by which the loud speaker 4 is driven. In this case, for the upper half cycle, the voltage difference VD−C between the voltage of the supply power D to the amplifier 3 and the voltage of the output signal C is controlled such that it is maintained at a value of 1 Vf which is near the minimum value necessary to operate the amplifier 3.

By this, power loss in the amplifier 3 becomes a voltage drop in the order of 1 Vf corresponding to the voltage difference VD−C and the power consumption is reduced as compared with the conventional consumption.

Although power loss due to switching of the power supply line is mainly due to resistance when the transistor Q62 is ON as mentioned previously, the power consumption can be restricted practically since the ON resistance value is small. Particularly, since the drive circuit for the PWM control for switching the transistor Q62 can be constituted by an IC circuit having a differential amplifier construction, its power consumption can be restricted to a small value compared with the power consumption of the power amplifier stage.

Figure 3:
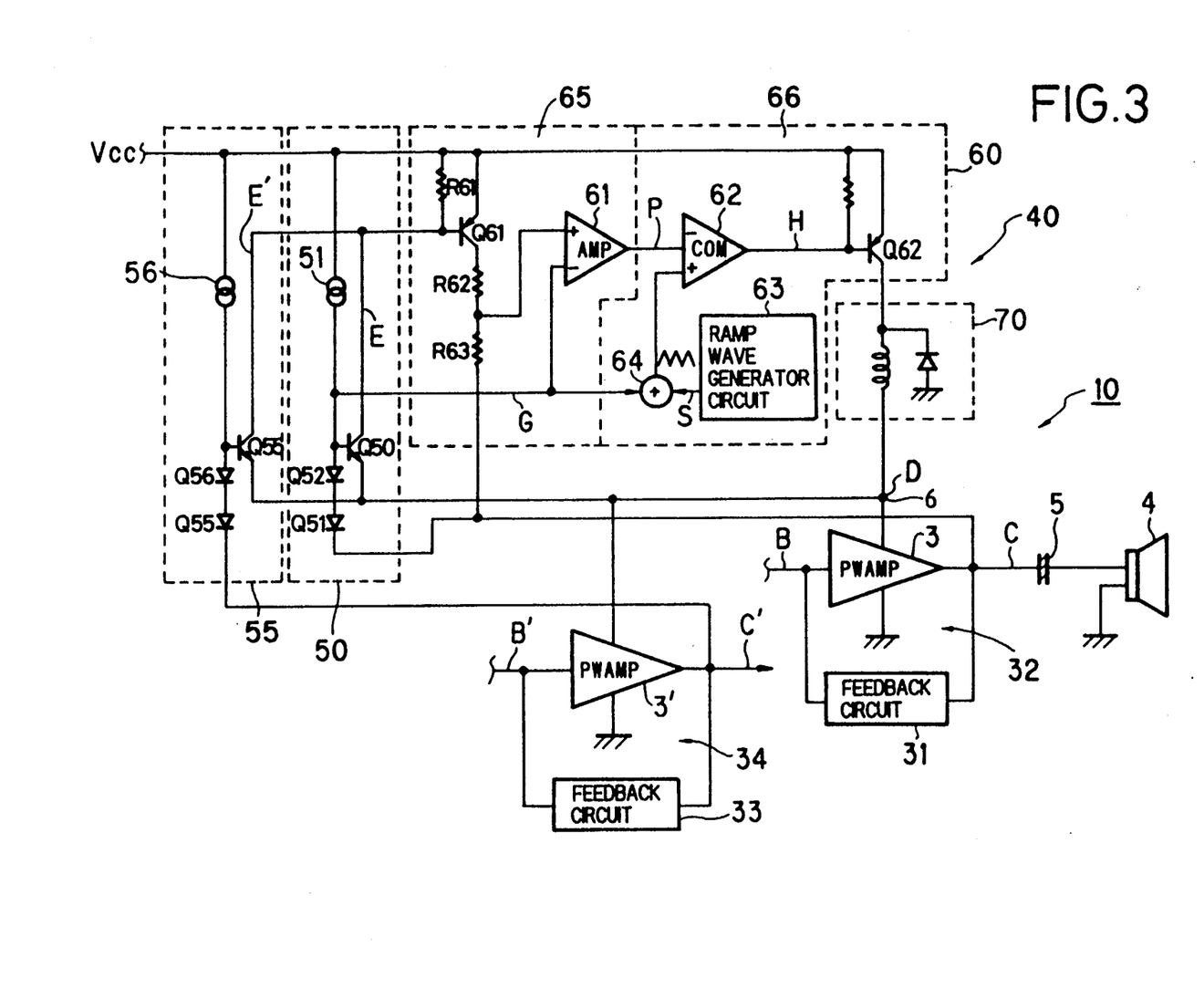
FIG. 3 is a block diagram of an audio device according to another embodiment of the present invention when applied to a portable stereo cassette tape player.

Next, a construction suitable for a stereo device will be described with respect to FIG. 3. In FIG. 3, the circuit construction including a loud speaker 4 and a supply power control circuit 40 (including a detection circuit 50, a switching regulation circuit 60 and a smoothing circuit 70) is the same as that of the preceding embodiment. In FIG. 3, an amplifier 3 includes a feedback circuit 31 as an output stage amplifier 32. Further, the amplifier 3′ shown in FIG. 6 includes a feedback circuit 33 as the output stage amplifier 34.

The amplifier 34 is connected to the supply power control circuit 40 through a detection circuit 55 and output terminal 6. The detection circuit 55 is similar to the detection circuit 50 and connected in parallel to the detection circuit 50. In this figure, circuit portions preceding and succeeding the amplifier 3′ are omitted. Further, a current source 56 of the detection circuit 55 corresponds to a current source 51 of the detection circuit 50.

The detection circuit 55 produces a detection signal E′ corresponding to whether or not a voltage difference VD−C′ between a voltage of a supply power D and an output signal voltage C′ is larger than 1 Vf. The detection signal E′ is wired-OR with a detection signal E and sent to a transistor Q61 of the switching regulation circuit 60.

By this, the PWM control in the switching regulation circuit 60 becomes dependent on not only the voltage difference VD−C but also the voltage difference VD−C′ on the side of the amplifier 34. Although current supplying operations of the respective amplifiers 32 and 34 is the same as in the described embodiment, the supply power control circuit 40 supplies currents to the amplifiers 32 and 34 in parallel. When the output signal C of the amplifier 3 increases and the output signal C' of the amplifier 3' increases by a smaller amount or decreases, resulting in different levels of these output signal voltages, the voltage of the supply power D follows one which is in this case the output signal C, which is higher in level than the other. The reason for this is that, due to the parallel connection of the detection circuits 50 and 55, the operation on the side of the transistor which is firstly turned ON is predominant. One of the transistors Q50 of the detection circuit 50 and the transistor Q55 of the detection circuit 55, which is turned ON earlier is the one of the output signals C and C' which is higher in level than the other. And, when the both transistors are in an On state, the PWM control is performed by a sum of the currents thereof.

On the other hand, when a stereo signal is being reproduced, a signal of low frequency band, a signal having a frequency not higher than, for example, 200 Hz, may have the same level in both channels and a large variation of output current is owed by the signal in such frequency band. Therefore, there is almost no distortion of the output signal even if the supply power control circuit 40 is connected commonly to the output stage amplifiers of these channels. Particularly, when the feedback circuits 31 and 33 are provided as shown in FIG. 3, the operation forcibly follows the voltage of the output signal of one of the amplifiers 32 and 34 whose supply power D is higher. However, even in such case, the level of the output signal which is lower is substantially not influenced thereby, resulting in reduced distortion of the output signal.

Although it is possible to further reduce signal distortion by providing the supply power control circuit 40 in each of the output stage amplifiers, it is better in view of restriction of power consumption to make the supply power control circuit 40 common as shown in FIG. 3. With this construction, a smoothed voltage of the supply power D is obtained in which the voltage difference on the side of either of the voltage difference VD−C of the detection circuit 50 and the voltage difference VD−C' of the detection circuit 55, which is changed by an amount smaller than 1 Vf, is substantially coincident with 1 Vf.

Describing its operation and power consumption in detail, when the voltage value of the output signal C of the amplifier 32 is not smaller than the voltage of the output signal C' of the amplifier 3', the voltage drop VD−C in the amplifier 32 is maintained at a small value of 1 Vf. Since voltage of the power source Vcc is larger than the voltage of the supply power D, power consumption becomes smaller than the conventional voltage drop=Vcc−C' (where Vcc is the voltage of the power source line Vcc and C' is the voltage of the output signal C') by an amount of Vcc−D (where D is the voltage of the supply power D). On the contrary, when the voltage value of the output signal C of the amplifier 32 is not larger than the voltage value of the output signal C' of the amplifier 34, the voltage drop in the amplifier 34 is kept at a small value of 1 Vf, in a reverse relation to the above.

Figure 4:
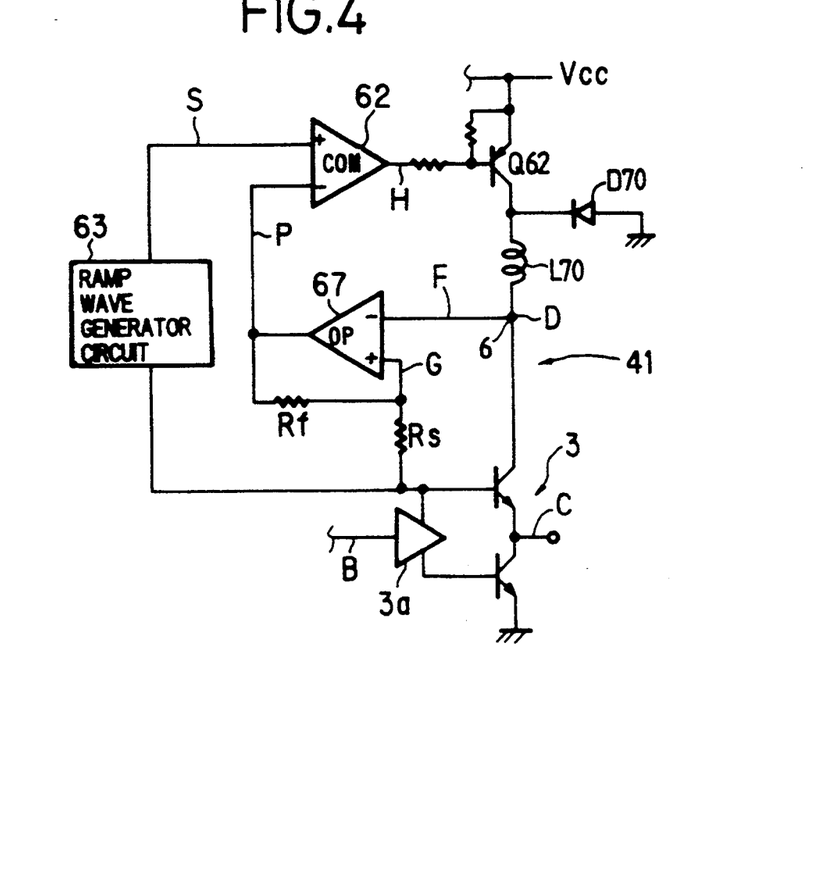
FIG. 4 is a block diagram of an audio device according to another embodiment of the present invention when applied to a portable cassette tape player.

FIG. 4 shows an embodiment of the supply power control circuit in which the detection signal is obtained by using the voltage of the input signal B as the voltage of one of the detection circuits to be detected, instead of the voltage of the output signal C.

In FIG. 4, the supply power control circuit 41 controls the output signal C and the supply power D such that the voltages thereof become constant correspondingly to the voltage of the input signal B and the voltage of the supply power D.

In FIG. 4, the same constructive components as those in FIG. 1 are depicted by the same reference numerals, respectively. Differences thereof from that shown in FIG. 1 are that a circuit from the detection circuit 50 to the amplifier 61 is replaced by a detection/amplifier circuit 67 constituted by an operational amplifier of inverted amplification type and that the reference signal G is set as a base bias potential of the transistor Q1. Therefore, the ramp wave generator circuit 63 also operates on a reference potential of a base of the transistor Q1.

The detection/amplifier circuit 67 has a (−) input terminal supplied with the voltage of the supply power D and a (+) input terminal supplied with the voltage of the input signal B obtained from the base of the transistor Q1 through a resistor Rs as a reference side potential. That is, the resistor Rs converts a current value of the input signal B into a voltage value. Further, it includes a feedback resistor Rf connected between an output side thereof and the (+) input terminal. A voltage of an output signal P thereof is sent to a (−) input terminal of the comparator 62 which is a reference input terminal. An output of the ramp wave generator circuit 63 is supplied to the (+) input terminal of the comparator 62. In such a circuit, a divided voltage signal F generated from the detection signal and the supply power D are coincident and the reference signal G becomes the same level due to the fact that the input terminal of the operational amplifier is a virtual short.

The difference between the voltages of the output signal and the input signal of the output stage amplifier is caused by a level difference therebetween corresponding to the amplification factor of the output stage amplifier, and the phase between the input signal and the output signal is the same substantially. Considering this matter, the same operation as that in the previous embodiment is possible even if the input signal B is made a detection object. Therefore, supply power control circuit 40 is changeable to the control circuit 41.

Figure 5:
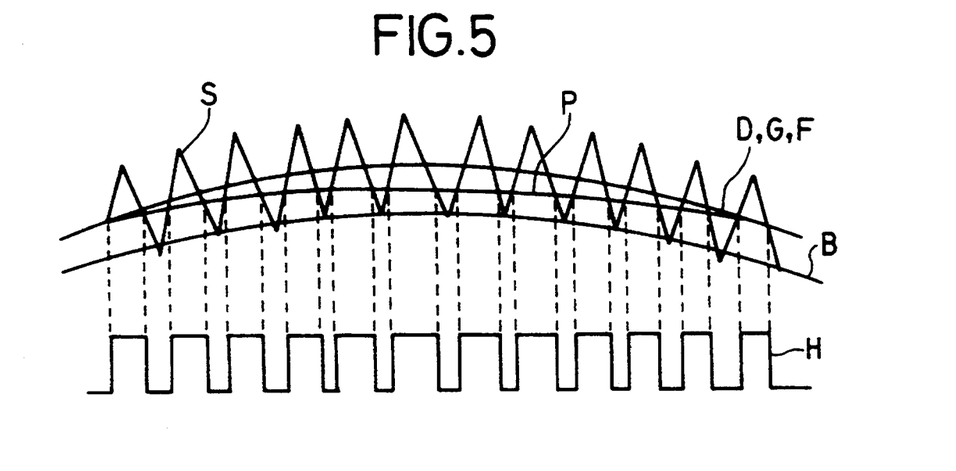
FIG. 5 shows waveforms for explaining an operation of a supply power control circuit in FIG. 4.

Frequency of the ramp signal S is much different from that of the input signal B. FIG. 5 explains the operation thereof theoretically with the frequency of the ramp signal S being low in relation to the input signal B.

As shown in FIG. 5, the ramp signal S and the reference signal P are obtained in correspondence with the input signal B and PWM pulse corresponding to the width of the ramp wave exceeding the reference signal P that is supplied to the transistor Q62. As a result, in relation to the output signal C, the PWM control is performed with the waveform relation (b) shown in FIG. 5.

Although, in the above mentioned embodiments, the reproduced signal in the tape player has been described as an example, other audio signals such as a microphone input or broadcast signal, input, etc. may be used. In such a case, the signal reproduction processing circuit may be a preamplifier to be inserted upstream of the output stage amplifier.

Further, although the example in which the amplified signal is sent to the loud speaker has been described, the present invention is not limited thereto. For example, such signal may be used as an input to a recording circuit or to a larger power amplifier.

Although the transistors Q50 and Q55 of the detection circuit 50 are NPN transistors, they may be PNP transistors. In such case, emitters thereof receive the output signal C and bases thereof receive the voltage signal of the supply power D.

If a larger current capacity is required, the by-pass capacitor Cn between the output terminal 6 of the supply power D and the ground GND may be replaced by a smoothing capacitor having larger capacity.

What is claimed is:

1. A device for amplifying an audio signal and supplying the amplified signal to a load, comprising:
   a first amplifier circuit for amplifying the audio signal;
   an output stage amplifier for amplifying an output of said first amplifier circuit and outputting it to said load;
   a switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of power supplied from a power source line in accordance with an output of said comparator for feeding power to said output stage amplifier;
   a smoothing circuit having a coil provided between the feed power output of said switching circuit and a terminal of said output stage amplifier for receiving the feed power and having a diode for forming a circulating path for supplying said output stage amplifier with a current of said coil in a period when said switching transistor is in an OFF state;
   a control circuit including a control voltage value generator circuit for generating a voltage value corresponding to a voltage difference between a voltage signal of the feed power and a voltage of an output signal of said output stage amplifier as the control signal, and supplying the voltage value to said another input of said comparator to control the comparator output for controlling a switching period of said switching transistor such that the voltage difference between the voltage of said output signal and the voltage of the feed power becomes substantially constant.

2. A stereo audio device for independently amplifying a right channel audio signal and a left channel audio signal of a stereo audio signal and for outputting the signals to loads corresponding to the right and left channels, respectively, said stereo audio device comprising:
   a first amplifier circuit for amplifying the right channel audio signal;
   a first output stage amplifier for amplifying an output of said first amplifier and supplying it to said load;
   a second amplifier circuit for amplifying the left channel audio signal;
   a second output stage amplifier for amplifying an output of said second amplifier and supplying it to said load;
   a switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of power supplied from a power source line in accordance with an output of said comparator for feeding power to said first output stage amplifier and second output stage amplifier;
   a smoothing circuit having a coil provided between the feed power output of said switching circuit and a terminal of said first and second output stage amplifiers for receiving the feed power and having a diode for forming a circulating path for feeding said first and second output stage amplifiers with a current of said coil in a period when said switching transistor is in an OFF state;
   a control circuit including a control voltage value generator circuit for generating first and second voltage values respectively corresponding to voltage differences between a voltage signal of the feed power of the smoothing circuit and voltages of a right channel output signal of said first output stage amplifier and a left channel output signal of said second output stage amplifier, wherein said first and second voltage values are logically ORed together to provide a third voltage value as the control signal and supplying the third voltage value to said another input of said comparator to control the comparator output for controlling a switching period of said switching transistor such that the voltage difference between each of the voltages of said right and left channel output signals and the voltage of the feed power of the smoothing circuit becomes substantially constant.

3. A power amplifier circuit for an audio signal comprising:
   an amplifier for amplifying an audio signal;
   a switching circuit including a ramp wave generator circuit oscillating at a frequency in a range from 50 kHz to 800 kHz, a comparator having one input supplied with an output of said ramp wave generator circuit and another input supplied with a control signal and a switching transistor for ON/OFF switching of power supplied from a power source line in accordance with an output of said comparator for feeding power to said amplifier;
   a smoothing circuit having a coil provided between the feed power output of said switching circuit and a terminal of said amplifier for receiving feed power and having a diode for forming a circulating path for supplying said amplifier with a current of said coil in a period when said switching transistor is in an OFF state;
   a control circuit including a control voltage value generator circuit for generating a voltage value corresponding to a voltage difference between a voltage signal of the feed power and a voltage of an output signal of said amplifier as the control signal and supplying the voltage value to said another input of said comparator to control the comparator output for controlling a switching period of said switching transistor such that the voltage difference between the voltage of said output signal and the voltage of the feed power becomes substantially constant.

4. The power amplifier circuit for an audio signal claimed in claim 3, wherein said control circuit includes a transistor responsive to the voltage signal of the feed power received in one of an emitter and a base thereof and said output signal voltage received in the other of the emitter and the base for generating a detection signal corresponding to a difference in voltage between the voltage difference and a predetermined voltage, and wherein said control voltage value generator circuit responds to the detection signal to generate the voltage value to thereby control the voltage difference to be substantially equal in potential to said predetermined voltage which is approximately a minimum voltage necessary to operate said amplifier.

5. The power amplifier circuit for an audio signal claimed in claim 4, wherein said output signal voltage received in the other of the emitter and the base passes through a diode circuit which generates said predetermined voltage.

6. The power amplifier circuit for audio signal claimed in claim 5, wherein said diode circuit comprises at least two diodes.

7. The power amplifier circuit for an audio signal claimed in claim 3, wherein said control voltage value generator circuit has a (+) input and a (−) input and is responsive to the voltage signal of the feed power being received in one of the (+) input and the (−) input and said output signal voltage being received in the other of the (+) input and the (−) input for generating said control signal.

8. The power amplifier circuit for an audio signal claimed in claim 7, wherein said output signal voltage received in the other of the (+) input and the (−) input passes through a resistor which generates a voltage of a value higher by a predetermined amount than said output signal voltage as a detection signal, said value of voltage being approximately a minimum voltage necessary to operate said amplifier.

* * * * *